United States Patent
Ma et al.

(10) Patent No.: US 9,190,967 B2
(45) Date of Patent: Nov. 17, 2015

(54) APPARATUS AND METHOD FOR ASYMMETRICALLY DRIVEN PARTIAL OUTPHASING POWER AMPLIFIER

(71) Applicant: FutureWei Technologies, Inc., Plano, TX (US)

(72) Inventors: Zhengxiang Ma, Summit, NJ (US); Ruikang Yang, Bridgewater, NJ (US); Munawar Kermalli, Morris Plains, NJ (US)

(73) Assignee: Futurewei Technologies Inc., Plano, TX (US)

( * ) Notice: Subject to any disclaimer, the term of this patent is extended or adjusted under 35 U.S.C. 154(b) by 0 days.

(21) Appl. No.: 14/197,028

(22) Filed: Mar. 4, 2014

(65) Prior Publication Data

US 2014/0266464 A1 Sep. 18, 2014

Related U.S. Application Data

(60) Provisional application No. 61/780,691, filed on Mar. 13, 2013.

(51) Int. Cl.
*H04L 25/49* (2006.01)
*H03F 3/21* (2006.01)
(Continued)

(52) U.S. Cl.
CPC ............... *H03F 3/21* (2013.01); *H03F 1/0288* (2013.01); *H03F 1/0294* (2013.01); *H03F 3/211* (2013.01); *H03F 3/24* (2013.01); *H03F 2200/432* (2013.01)

(58) Field of Classification Search
CPC ......... H03F 1/0294; H03F 3/211; H03F 1/32; H03F 3/24; H03F 2200/336; H03F 1/0261; H03F 1/0211; H03F 1/3247; H03F 1/3241; H03F 3/602; H03F 1/0288; H03F 2200/451; H03F 2200/387; H04B 1/0483; H04B 2001/0408; H04L 27/368; H04L 25/03847; H03G 3/3042
USPC .................. 375/295, 285, 296, 297; 330/250, 330/142 R; 332/106, 107, 123, 117, 149, 332/159, 160
See application file for complete search history.

(56) References Cited

U.S. PATENT DOCUMENTS 7,009,447 B2 * 3/2006 Korol .............................. 330/10
8,095,092 B2 * 1/2012 Muller et al. ............... 455/127.1
(Continued)

OTHER PUBLICATIONS

Godoy et al., "A 2.4-GHz, 27-dBm Asymmetric Multilevel Outphasing Power Amplifier in 65-nm CMOS," IEEE Journal of Solid State Circuit, vol. 47, pp. 2372-2385, Oct. 2012.*
(Continued)

*Primary Examiner* — Tesfaldet Bocure
(74) *Attorney, Agent, or Firm* — Slater & Matsil, L.L.P.

(57) ABSTRACT

Apparatus and method embodiments are provided for improving power efficiency in an outphasing amplifier with a non-isolating combiner. The embodiments include reducing the driving power to two power amplifiers (PAs) of the amplifier circuit in the low input signal power region in an asymmetric manner between the two PAs. An embodiment method includes receiving, at a signal decomposer, an input signal, detecting a power amplitude of the input signal, and determining whether the input signal corresponds to one of a plurality of operation modes according to the detected power amplitude of the input signal and a plurality of power thresholds corresponding to the operation modes. Upon determining that the power amplitude of the input signal corresponds to a first mode from the operation modes, the input signal is decomposed into two component signals including at least one signal that has a reduced and scaled amplitude proportional to the input signal.

21 Claims, 4 Drawing Sheets

(51) Int. Cl.
*H03F 3/24* (2006.01)
*H03F 1/02* (2006.01)

(56) References Cited

U.S. PATENT DOCUMENTS

| | | | |
|---|---|---|---|
| 8,346,189 B2 | 1/2013 | Dupuy et al. | |
| 8,451,053 B2* | 5/2013 | Perreault et al. | 330/124 R |
| 8,472,896 B2 | 6/2013 | Xu et al. | |
| 8,659,353 B2 | 2/2014 | Dawson et al. | |
| 8,824,978 B2 | 9/2014 | Briffa et al. | |
| 8,913,974 B2* | 12/2014 | Sorrells et al. | 455/127.1 |
| 2005/0110590 A1 | 5/2005 | Korol | |
| 2013/0241625 A1 | 9/2013 | Perreault et al. | |
| 2014/0118063 A1* | 5/2014 | Briffa et al. | 330/124 R |
| 2014/0120854 A1* | 5/2014 | Briffa et al. | 455/127.3 |
| 2014/0125412 A1 | 5/2014 | Dawson et al. | |
| 2014/0266465 A1 | 9/2014 | Kermalli | |
| 2014/0269892 A1 | 9/2014 | Ma et al. | |

OTHER PUBLICATIONS

Chung, et al., "Asymmetic Multilevel Outphasing Architecure for Multi-Standard Transmitters," Radio Frequency Integrated Circuits Symposium, IEEE, RFIC, Jun. 7-9, 2009, pp. 237-240.

Perreault, David J., "A New Power Combining and Outphasing Modulation System for High-Efficiency Power Amplification," 53rd IEEE International Midwest Symposium on Circuits and Systems, Aug. 1-4, 2010, pp. 441-444.

Gerhard, W., et al., "Improvement of Power Amplifier Efficiency by Reactive Chireix Combining, Power Back-off and Differential Phase Adjustment," IEEE, Jun. 2006, pp. 1887-1890.

Qureshi, J.H., "A 90-W Peak Power GaN Outphasing Amplifier With Optimum Input Signal Conditioning," IEEE Transaction on Microwave Theory and Technologies, vol. 57, No. 8, Aug. 2009, pp. 1925-1935.

* cited by examiner

APPARATUS AND METHOD FOR ASYMMETRICALLY DRIVEN PARTIAL OUTPHASING POWER AMPLIFIER

This application claims the benefit of U.S. Provisional Patent Application Ser. No. 61/780,691, filed on Mar. 13, 2013, and entitled "System and Method for Asymmetrically Driven Partial Outphasing Power Amplifier," which application is incorporated herein by reference.

TECHNICAL FIELD

The present invention relates to power amplifier architecture and design, and, in particular embodiments, to apparatus and method for an asymmetrically driven partial outphasing power amplifier.

BACKGROUND

An outphasing amplifier with a non-isolating combiner is an amplifier circuit that can provide substantially high power efficiency over a wide input range. The power efficiency is a measure of the power needed to operate the amplifier for amplifying an input signal to a specific output level. However, the efficiency of such amplifier circuit drops quickly in the low input power region, where considerable power is needed to amplify relatively low input power signals. This can reduce the overall efficiency for amplifying a modulated waveform with a large peak to average power ratio. There is a need for an improved architecture for the outphasing amplifier with a non-isolating combiner that overcomes such issue to improve overall power efficiency of the system.

SUMMARY OF THE INVENTION

In accordance with an embodiment, a power amplifier includes a signal decomposer configured to decompose an input signal corresponding to a reduced power range into two component signals having different reduced amplitude ratios proportional to the input signal and a fixed phase angle difference used for the reduced power range, two power amplifiers (PAs) coupled to the signal decomposer. Each one of the two PAs is configured to amplify one corresponding signal component of the two component signals. The power amplifier further includes a non-isolating combiner coupled to the two PAs and configured to combine the two amplified component signals to provide an output signal.

In accordance with another embodiment, a method for power amplification in an outphasing amplifier circuit includes receiving, at a signal decomposer, an input signal, determining whether the input signal corresponds to a first power region or a second power region, and upon determining that the input signal corresponds to the first power region, decomposing the input signal into a first signal and a second signal that have different ratios of magnitude proportional to the input signal and a fixed phase angle difference used for the first power region. The method further includes amplifying the first signal at a first PA and the second signal at a second PA, and combining, at a non-isolating combiner, the amplified first signal and second signal to provide an amplified output signal corresponding to the input signal.

In accordance with yet another embodiment a method for power amplification in an outphasing amplifier circuit includes receiving, at a signal decomposer, an input signal, detecting a power amplitude of the input signal, determining whether the input signal corresponds to one of a plurality of operation modes according to the detected power amplitude of the input signal and a plurality of power thresholds corresponding to the operation modes, and upon determining that the power amplitude of the input signal corresponds to a first mode from the operation modes, decomposing the input signal into two component signals including at least one signal that has a reduced and scaled amplitude proportional to the input signal. The method further includes amplifying each one of the two component signals at one corresponding PA of two PAs, and combining, at a non-isolating combiner, the amplified two component signals to provide an output signal.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

System and method embodiments are provided for improving power efficiency in an outphasing amplifier with a non-isolating combiner, such as a Chireix combiner. The embodiments include backing off (reducing) the driving power to the two power amplifiers (PAs) of the system in the low input signal power region in an asymmetric manner between the two PAs. Different reduced power is applied to each PA proportional to the original input signal in the reduced power region, also referred to herein as the back-off region. The asymmetrically driven PAs are also operated in a linear amplification mode in the back-off region (e.g., instead of non-linear amplification for higher input signal power). The two PAs may also be biased asymmetrically (e.g., using different bias voltages for the gate, the drain, or both) to further improve linearity and efficiency. Since the input power to the PAs is reduced in the back-off region, the power consumption of the drivers in this region is improved, which improves the overall power efficiency of the system. The overall efficiency can be substantially improved for relatively high dynamic range signals, such as for Long Term Evolution (LTE) signals. For instance, the systems and methods can be implemented to achieve higher power efficiency for a base station system, such as an LTE-compliant cellular system.

Figure 1:
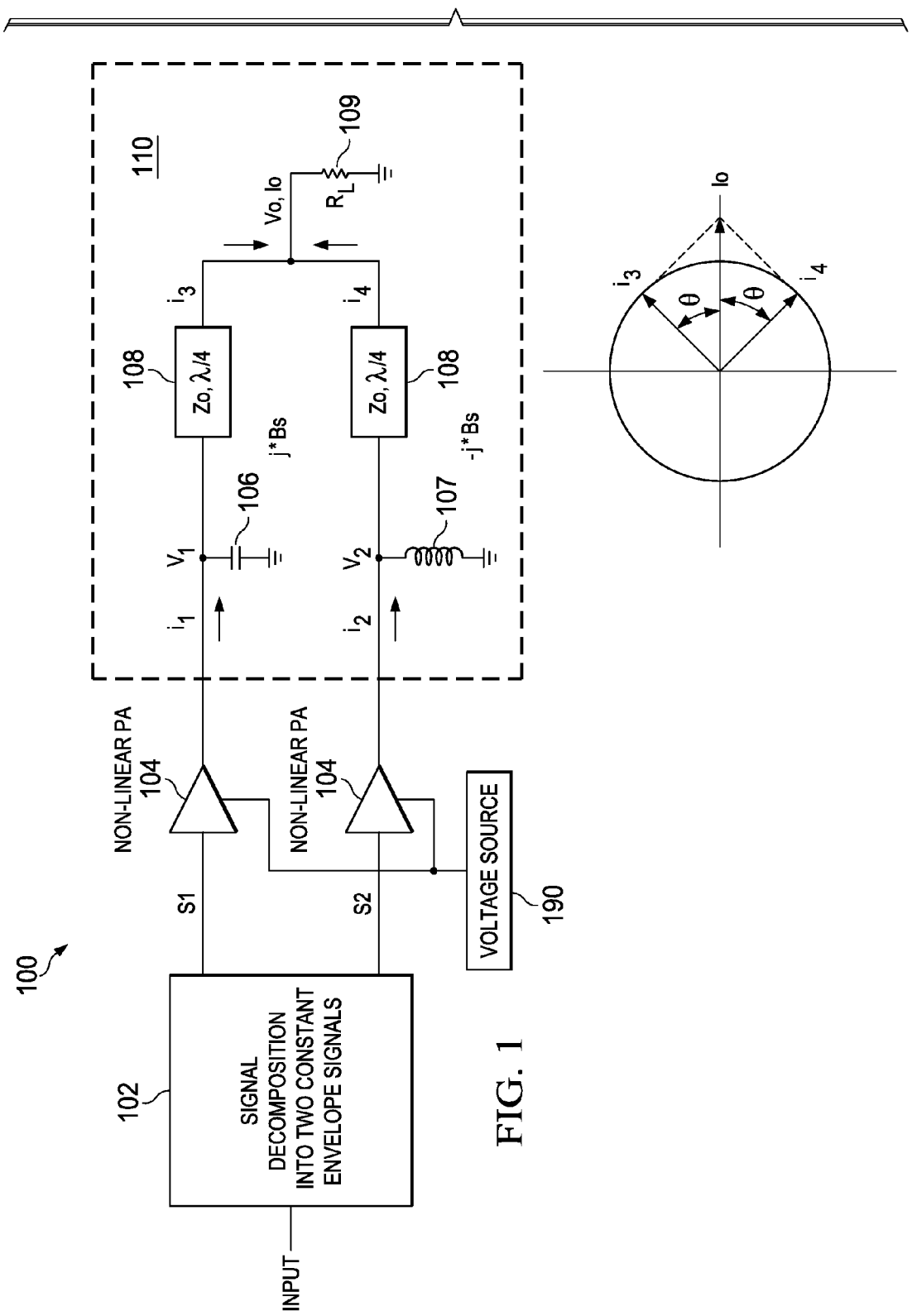
FIG. 1 shows an example of an outphasing amplifier circuit with a Chireix combiner.

FIG. 1 shows an outphasing amplifier circuit 100 with a Chireix combiner 110. In addition to the Chireix combiner 110, the outphasing amplifier circuit 100 comprises a signal decomposer 102 (e.g., including one or more circuit components or devices) and two PAs 104 (e.g., operating in nonlinear amplification mode) coupled to the signal decomposer 102 and the Chireix combiner 110. The system may be used in any transmitter/receiver (transceiver) component such as in communications or network components, for example in a base station system.

The signal decomposer 102 decomposes an input signal into two constant envelope signals $S_1$ and $S_2$ (also referred to herein as component signals), and sends each of signals $S_1$ and $S_2$ to a corresponding one of two PAs 104. $S_1$ and $S_2$ may be current signals. The signal decomposer 102 also introduces an outphasing angle between $S_1$ and $S_2$ as a function of the input signal power. Each of the PAs 104 receives one of the outphased constant envelope signals, amplifies the signal (e.g., in non-linear mode), and outputs the amplified signal to the Chireix combiner 110. The Chireix combiner 110 comprises a first branch coupled to one of the PAs 104 and a second branch coupled to the other PA 104. The first branch includes a capacitor 106 to ground coupled in parallel to an transmission line 108 and a load or resistance 108. The second branch includes an inductor 107 to ground coupled in parallel to a second transmission line 108 and the load or resistance 109. The Chireix combiner 110 combines a first output (current $i_1$) and a second output (current $i_2$) from the two corresponding branches 104 into an output $I_0$. The components of the Chireix combiner 110 may be arranged as shown in FIG. 1 or any other suitable arrangement. The load 109 may also be located outside the Chireix combiner 110. The outphasing amplifier circuit 100 may also include a voltage source 190 configured to apply bias voltages to the two PAs 104.

As described above, the outphasing amplifier circuit 100 decomposes (using the signal decomposer 102) an input signal with amplitude variation into two constant envelope signals and introduces an outphased angle between the two as a function of the variable input signal amplitude (or power), amplifies each of the two signals with high-efficiency non-linear amplifiers (the PAs 104), and combines (using the Chireix combiner 110) the amplified signals to produce an amplified output version of the input signal. The Chireix combiner 110 implements non-isolating combining, e.g., there is no dissipation of radio frequency (RF) power in the combiner and the two nonlinear PAs 104 are load-pulling each other. The Chireix combiner 110 reactively loads each branch so that the nonlinear PAs 104 work in their high power efficiency region (e.g., on a Smith chart). High power efficiency is achieved when the amplifier uses relatively low driving or input power to the PAs 104 to provide relatively high amplification or gain to the input signal.

However, the efficiency of the PAs 104 drops quickly when the input signal is in the back-off region, e.g., in comparison to other PAs such as a Doherty PA. The back-off or reduced signal region where low efficiency is observed may vary between different signal types, systems, or architectures. For example, in the case of high dynamic range signals such as LTE signals, the efficiency for a modulated waveform is no longer sufficiently high in the back-off region (e.g., below about 10 dB of peak power) in comparison to the efficiency of the signal for higher input signal power. Since the input signals are typically most of the time at peak power level, significant driving power is required for the PAs 104, which lowers overall system efficiency.

Figure 2:
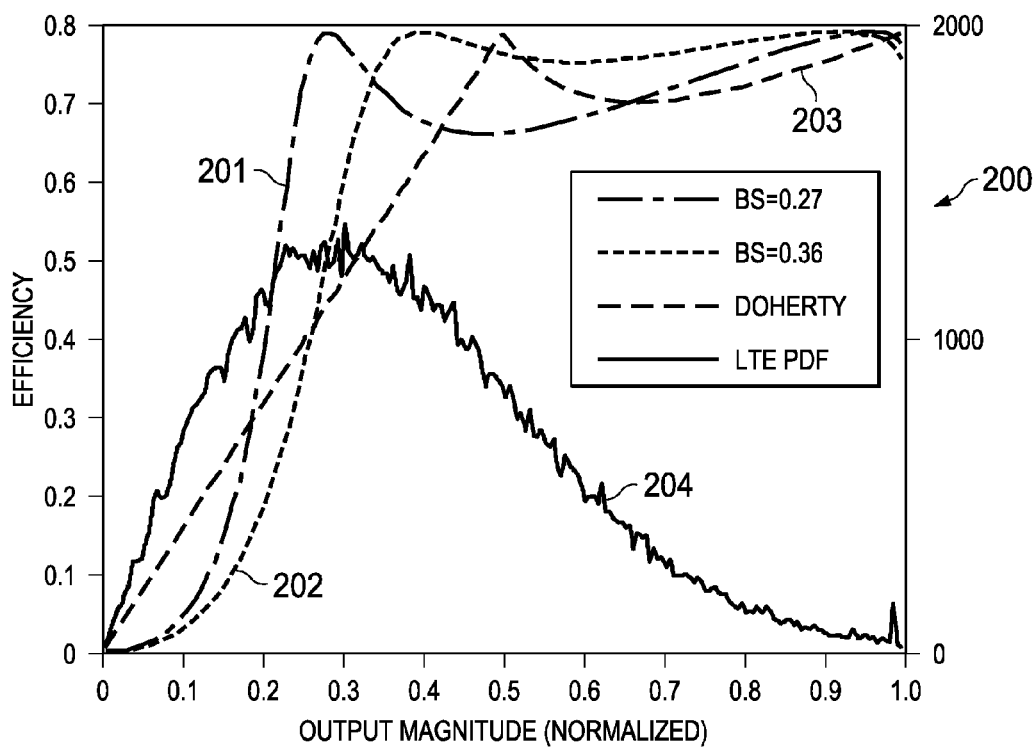
FIG. 2 shows a graph of the efficiency of the outphasing amplifier architecture of FIG. 1 operated in a conventional manner.

FIG. 2 shows a graph 200 of the efficiency of the PAs 104 in the outphasing amplifier circuit 100 in the operation mode described above. The graph 200 includes curves of efficiency vs. normalized output magnitude in the first PA 104 associated with the capacitive branch of the Chireix combiner 110 (curve 201) and the second PA 104 associated with the inductive branch of the Chireix combiner 110 (curve 202). For comparison, the graph 200 also includes an efficiency curve of a Doherty PA (curve 203). The graph 200 also shows the probability distribution function of a LTE signal curve 204 at various signal magnitudes. As shown, curves 201 and 202 have higher efficiency than curve 203 for the Doherty PA for the LTE signal at output magnitudes higher than 0.2. However, the efficiency for curves 201 and 202 drops quickly below 0.2 normalized output magnitude (in a reduced power or back-off region), where the efficiency of curve 203 becomes better.

In an embodiment, to overcome the efficiency drop in the back-off region, the back-off region operation of an outphasing amplifier circuit with a Chireix combiner or any other suitable non-isolating combiner is modified from the operation mode described above. However, the normal outphasing operation above can still be used for the higher signal power region, also referred to herein as the "normal" operation mode (outside or above the back-off region). In the back-off region, instead of outphasing the angles between the two component or driving signals to the PAs 104 (e.g., $S_1$ and $S_2$), as is performed in the normal operation mode, the driving or component signal power to the PAs 104 in the two branches can be reduced (backed off) gradually and asymmetrically between the two. The power of the component or driving signals to the two PAs 104 (e.g., $S_1$ and $S_2$) are reduced at different rates proportional to the original input power level and with or without varying an outphasing angle between the two signals (e.g., the phase angle between the two may or may not be fixed). Since a reduced signal power is used to drive the PAs 104 in the back-off region, the power efficiency for the back-off region is improved, and hence the overall power efficiency of the system is improved.

Figure 3:
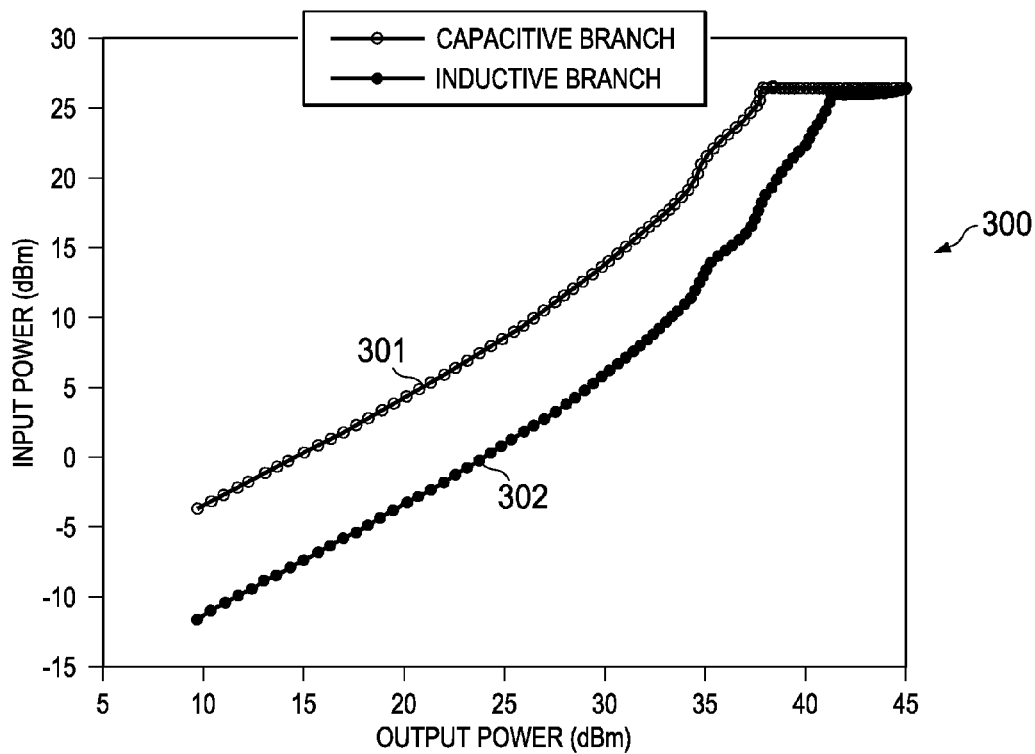
FIG. 3 shows a graph of input power for asymmetrically driving the power amplifiers (PAs) of FIG. 1.
Figure 4:
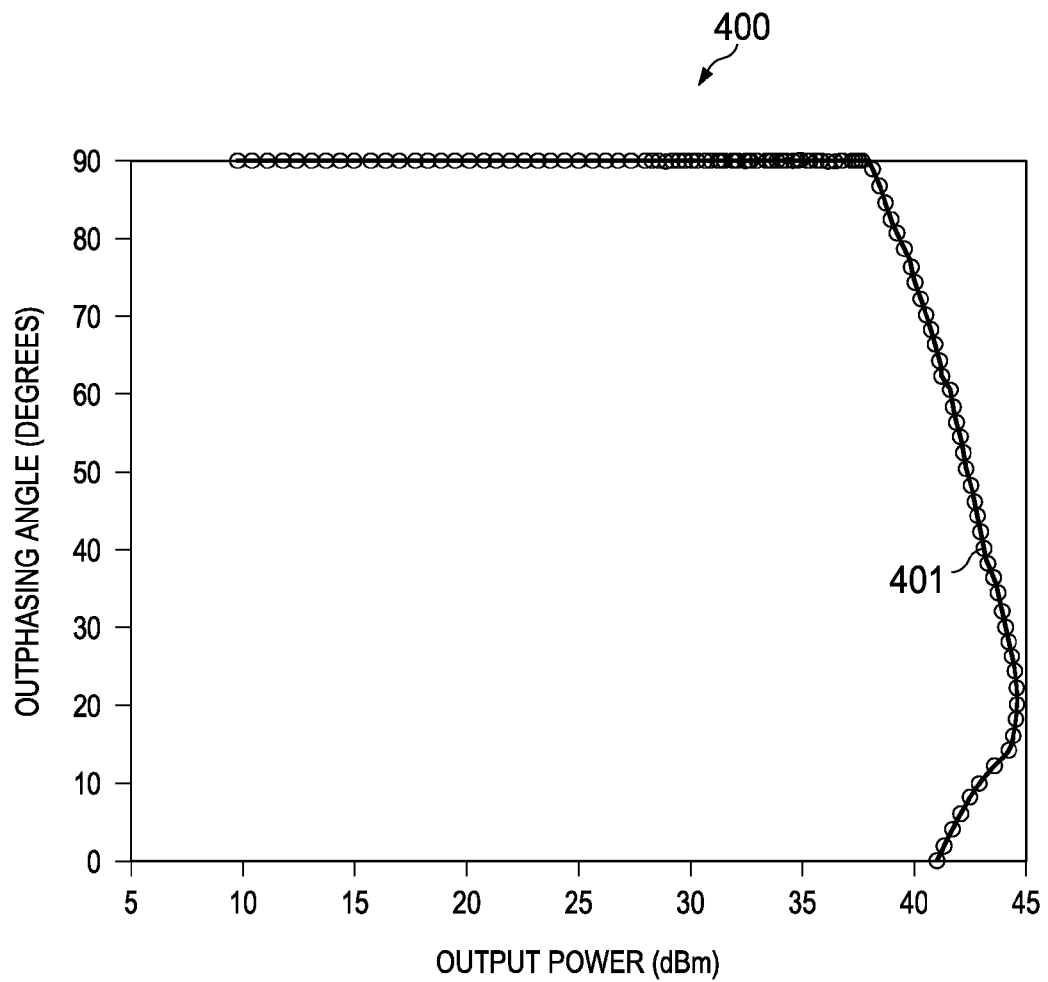
FIG. 4 shows a graph of the outphasing angle between the asymmetrically driven PAs of FIG. 1.

FIG. 3 shows a graph 300 of input driving power that can be applied to the PAs 104. The graph 300 includes curves of input power vs. output power (in dBm) in the first PA 104 associated with the capacitive branch of the Chireix combiner 110 (curve 301) and the second PA 104 associated with the inductive branch of the Chireix combiner 110 (curve 302). FIG. 4 shows a corresponding graph 400 with a curve 401 of the applied outphasing angle between the PAs 104. Curve 302 shows backing off the component signal (e.g., $S_2$) to the PA 104 associated with the inductive branch below a first output power value gradually and proportional to the amplified output power (and hence also proportional to the original input signal power to the signal decomposer 102). Curve 301 shows backing off the component signal (e.g., $S_1$) to the other PA 104 associated with the capacitive branch below a second output power value also gradually and proportional to the amplified output power and the original input signal power. Curve 301 also shows that the reduced signal ($S_1$) to the second PA 104 is maintained higher than the back-off signal ($S_2$) to the first PA 104 in the back-off region.

Using different thresholds or timing to begin backing off the component signals to the PAs 104 and different reduced amplitude rates between the two is referred to herein as asymmetrically driving the two PAs 104 of the outphasing amplifier circuit. Additionally, as shown by curve 401, the phase angle between the two PAs 104 is fixed at some point in the back-off region, for example when both component signals are being backed off. The phase angle may be fixed at about 90 degrees or any other suitable fixed value. At the top power region, the normal outphasing operation mode is used, where a variable outphasing angle between the two component signals is introduced as a function of the input signal (and the component signals are fixed at an equal maximum).

Further, in an embodiment, the two PAs can also be biased asymmetrically (e.g., using different bias voltages for the gate, the drain, or both) to further improve linear amplification and efficiency. For example, suitable asymmetric (different) bias gate voltages can be selected to further improve the linear amplification and the efficiency of the system.

In another embodiment to implement the asymmetric driven PA operation for the back-off mode, a plurality of operation modes can be used based on three determined power thresholds, $A_1$, $A_2$, and $A_3$, where $A_1 > A_2 > A_3$. Above A1 (the highest threshold point), normal signal decomposition or normal outphasing mode can be used. Accordingly, for an original input signal $|S| > A_1$, the first component signal to a first PA (e.g., associated with the capacitive branch of the non-isolating or Chireix combiner) is $S_1 = Ae^{i(\theta+\phi)}$ and the second component signal to a second PA (e.g., associated with the inductive branch of the non-isolating or Chireix combiner) is $S_2 = Ae^{i(-\theta+\phi)}$, where $\theta$ is the outphasing angle and $\phi$ is the phase of the original signal S.

Between $A_1$ and the next lower threshold $A_2$, the magnitude of $S_1$ is scaled according to $|S|$, the magnitude of $S_2$ remains at A, and the component signals are still outphased with the outphasing angle $\theta$. Accordingly, for $A_1|S|>A_2$, $$S_1 = \frac{A}{A_1} S \cdot e^{i\theta}$$

and $S_2 = Ae^{i(-\theta+\phi)}$, where $S_1$ is scaled such that to ensure signal magnitude continuity through the transition between the two operation modes. Between $A_2$ and the next lower threshold $A_3$, both the magnitudes of $S_1$ and $S_2$ are scaled according to $|S|$ and the component signals are still outphased with the outphasing angle $\theta$. Accordingly, for $A_2|S|>A_3$, $$S_1 = \frac{A}{A_1} S \cdot e^{i\theta} \text{ and } S_2 = \frac{A}{A_2} S \cdot e^{-i\theta},$$

where $S_1$ and $S_2$ are scaled such that to ensure magnitude continuity through the transition between the two operation modes. Below $A_3$, both magnitudes of $S_1$ and of $S_2$ continue to be scaled down according to $|S|$, but without outphasing the angle between the two (the phase angle between the two is kept fixed). Accordingly, for $|S| \leq A_2$, $$S_1 = \frac{A}{A_1} S \cdot e^{i\theta_0} \text{ and } S_2 = \frac{A}{A_2} S \cdot e^{-i\theta_0},$$

where $\theta_0$ is the outphasing angle corresponding to the magnitude of $A_3$ that remains fixed in the region below $A_3$.

Figure 5:
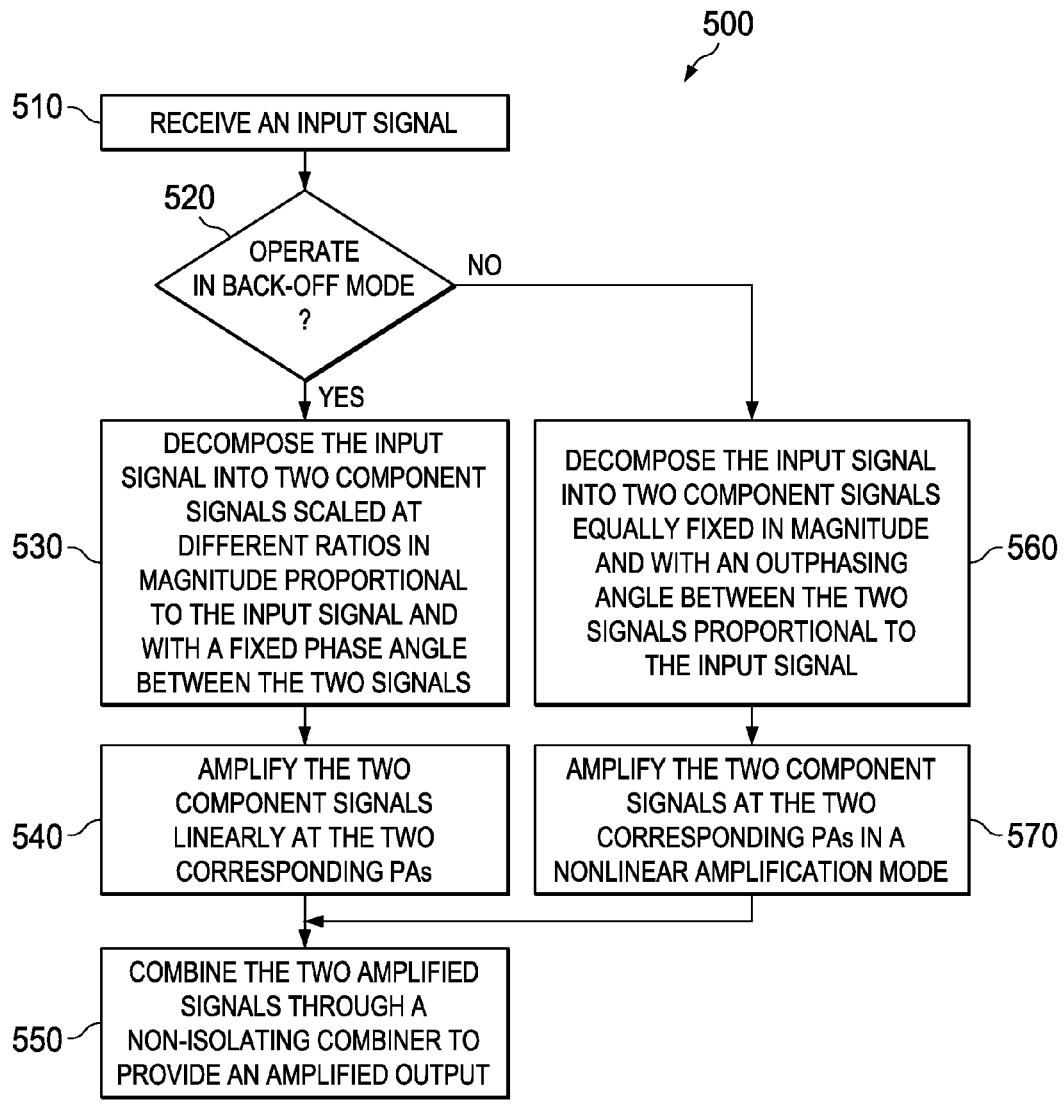
FIG. 5 shows an embodiment of an operation method of an asymmetrically driven outphasing amplifier.

FIG. 5 shows an embodiment operation method 500 of an asymmetrically driven outphasing PA circuit. For example, the method 500 can be used to asymmetrically drive the PAs 104 in the outphasing amplifier circuit 100 with the Chireix combiner 110 in the back-off region. At step 510, an input signal is received, e.g., at the signal decomposer 102. At step 520, the method 500 determines (e.g., at the signal decomposer 102) whether to operate in back-off mode (for lower power signals) according to the input signal's power. If the back-off mode operation is chosen, for example when a relatively low input signal below a threshold is detected, then the method 500 proceeds to step 530. Otherwise, the normal outphasing operation mode is chosen and the method 500 proceeds to step 560.

At step 530, the input signal is decomposed (e.g., at the signal decomposer 102) into two component signals (e.g., $S_1$ and $S_2$) scaled at different ratios in magnitude proportional to the input signal. Further, the phase angle between the two component signals is fixed, for example at an outphasing angle value corresponding to a threshold or cut-off power value that determines the back-off region. In an embodiment, at a middle power region between the normal or high power region and the deep back-of region (e.g., where $A_1 \geq |S| > A_2$), the two PAs 104 are asymmetrically driven ($S_1$ and $S_2$ scaled at different ratios in magnitude) but the outphasing angle between the two component signals continues to be changed, as described above. At step 540, the two component signals are sent to drive the two corresponding PAs of the outphasing amplifier circuit, where the two components are linearly amplified. At step 550, the two amplified signals from the two PAs are combined through a non-isolating combiner to provide an amplified output signal for the input signal.

Alternatively, at step 560, the input signal is decomposed (e.g., at the signal decomposer 102) into two component signals (e.g., $S_1$ and $S_2$) equally fixed in magnitude, e.g., at a maximum power level. Further, the phase angle between the two signals is outphased or varied proportional to the input signal. At step 570, the two component signals are sent to drive the two corresponding PAs, where the two components are amplified by in a non-lineal amplification mode. The method 500 then proceeds to step 550 to provide the amplified output signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A power amplifier comprising:
   a signal decomposer configured to decompose an input signal corresponding to a reduced power range into two component signals having different ratios of magnitude proportional to the input signal and a fixed phase angle difference used for the reduced power range;
   two power amplifiers (PAs) coupled to the signal decomposer, wherein each one of the two PAs is configured to amplify one corresponding signal component of the two component signals; and
   a non-isolating combiner coupled to the two PAs and configured to combine the two amplified component signals to provide an output signal.

2. The power amplifier of claim 1, wherein the signal decomposer is further configured to decompose a second input signal outside the reduced power range into two second component signals having an equal constant amplitude used outside the reduced power range and an outphasing angle between the two component signals that is a function of the input signal's magnitude.

3. The power amplifier of claim 2, wherein the equal constant amplitude of the two second component signals used outside the reduced power range is greater than both reduced amplitudes of the two component signals corresponding to the reduced power range.

4. The power amplifier of claim 1, further comprising a voltage source coupled to the two PAs and configured to apply different bias voltages to the PAs.

5. The power amplifier of claim 4, wherein the voltage source is configured to apply the different bias voltages to a gate, a drain, or both a gate and a drain at each of the two PAs.

6. A method for power amplification in an outphasing amplifier circuit, the method comprising:
receiving, at a signal decomposer, an input signal;
determining whether the input signal corresponds to a first power region or a second power region;
upon determining that the input signal corresponds to the first power region, decomposing the input signal into a first signal and a second signal that have different ratios of magnitude proportional to the input signal and a fixed phase angle difference used for the first power region;
amplifying the first signal at a first power amplifier (PA) and the second signal at a second PA; and
combining, at a non-isolating combiner, the amplified first signal and second signal to provide an amplified output signal corresponding to the input signal.

7. The method of claim 6, wherein the first power region is a back-off power region with reduced power output, and wherein the second power region is a higher power region in comparison to the back-off region.

8. The method of claim 6 further comprising:
detecting a power magnitude of the input signal; and
determining that the input signal corresponds to the first power region if the detected power magnitude is below a threshold power for the first power region.

9. The method of claim 6 further comprising applying in the first power region different bias voltages to the first PA and the second PA.

10. The method of claim 9, wherein the different bias voltages are applied to a gate, a drain, or both a gate and a drain at each of the first PA and the second PA.

11. The method of claim 6 further comprising:
upon determining that the input signal corresponds to the second power region, decomposing the input signal into a first signal and a second signal that have an equal constant magnitude used for the second power region and an outphasing angle difference proportional to a power magnitude of the input signal; and
amplifying the first signal at the first PA and the second signal at the second PA.

12. The method of claim 6 further comprising:
determining whether the input signal corresponds to a middle power region between the first power region and the second power region;
upon determining that the input signal corresponds to the middle power region, decomposing the input signal into a first signal and a second signal that have different ratios of magnitude proportional to the input signal and an outphasing angle difference proportional to a power magnitude of the input signal; and
amplifying the first signal at the first PA and the second signal at the second PA.

13. A method for power amplification in an outphasing amplifier circuit, the method comprising:
receiving, at a signal decomposer, an input signal;
detecting a power amplitude of the input signal;
determining whether the input signal corresponds to one of a plurality of operation modes according to the detected power amplitude of the input signal and a plurality of power thresholds corresponding to the operation modes;
upon determining that the power amplitude of the input signal corresponds to a first mode from the operation modes, decomposing the input signal into two component signals including at least one signal that has a reduced and scaled amplitude proportional to the input signal;
amplifying each one of the two component signals at one corresponding power amplifier (PA) of two PAs; and
combining, at a non-isolating combiner, the amplified two component signals to provide an output signal.

14. The method of claim 13, wherein the power thresholds include a first power threshold, a second power threshold below the first power threshold, and a third power threshold below the second power threshold, and wherein the first mode is a back-off mode that begins below the first power threshold.

15. The method of claim 14 further comprising:
upon determining that the detected power amplitude of the input signal is above the first power threshold, decomposing the input signal into two component signals that have equal constant envelope signal amplitude higher than the first power threshold and an outphasing angle difference proportional to the detected power amplitude of the input signal.

16. The method of claim 14 further comprising:
upon determining that the detected power amplitude of the input signal is below the first power threshold and above the second power threshold, decomposing the input signal into two component signals including a first signal that has a scaled amplitude proportional to a product of the input signal and an inverse of the first power threshold, a second signal that has a constant envelope signal amplitude higher than the first power threshold, and an outphasing angle difference between the two component signals proportional to the detected power amplitude of the input signal.

17. The method of claim 14 further comprising:
upon determining that the detected power amplitude of the input signal is below the second power threshold and above the third power threshold, decomposing the input signal into two component signals including a first signal that has a scaled amplitude proportional to a product of the input signal and an inverse of the first power threshold, a second signal that has a scaled amplitude proportional to a product of the input signal and an inverse of the second power threshold, and an outphasing angle difference between the two component signals proportional to the detected power amplitude of the input signal.

18. The method of claim 14 further comprising:
upon determining that the detected power amplitude of the input signal is below the third power threshold, decomposing the input signal into two component signals including a first signal that has a scaled amplitude proportional to a product of the input signal and an inverse of the first power threshold, a second signal that has a scaled amplitude proportional to a product of the input signal and an inverse of the second power threshold, and a fixed outphasing angle difference between the two component signals independent from the detected power amplitude of the input signal.

19. The method of claim 13 further comprising passing the one signal that has a reduced and scaled amplitude proportional to the input signal on a capacitive branch of the non-isolating combiner to combine the amplified two component signals.

20. The method of claim 13 further comprising applying different bias voltages to the first PA and the second PA, wherein the different bias voltages are applied to gates, drains, or both gates and drains at the first PA and the second PA.

21. The method of claim 20, wherein the different bias voltages are applied to the first PA and the second PA in the first mode.

\* \* \* \* \*